United States Patent
Henderson

(10) Patent No.: US 8,207,636 B2
(45) Date of Patent: Jun. 26, 2012

(54) POWER CONTROL INTERRUPT MANAGEMENT

(75) Inventor: Eric Alan Henderson, Rockford, IL (US)

(73) Assignee: Hamilton Sundstand Corporation, Windsor Locks, CT (US)

( * ) Notice: Subject to any disclaimer, the term of this patent is extended or adjusted under 35 U.S.C. 154(b) by 2061 days.

(21) Appl. No.: 10/925,759

(22) Filed: Aug. 25, 2004

(65) Prior Publication Data

US 2006/0044721 A1 Mar. 2, 2006

(51) Int. Cl.
*H03L 5/00* (2006.01)
(52) U.S. Cl. ........................ 307/130
(58) Field of Classification Search ........... 307/130
See application file for complete search history.

(56) References Cited

U.S. PATENT DOCUMENTS 6,714,429 B2 * 3/2004 Phadke ............... 363/89

FOREIGN PATENT DOCUMENTS

JP 01142326 A * 6/1989

* cited by examiner

*Primary Examiner* — Adi Amrany
(74) *Attorney, Agent, or Firm* — Carlson, Gaskey & Olds, PC

(57) ABSTRACT

A solid state power control includes a sensor to detect when the power control is not connected to a power source. Disconnecting the power source turns off an output stage in the power control. If the power control receives a command to turn on its output stage while the power source is disconnected from the power control or otherwise not present, logic in the power control prevents the command from reaching the output stage. When the power source is connected or reconnected to the power control, the output stage remains off until the logic detects a zero crossing in the power source, thereby preventing high inrush currents into the power control. Suppressing high inrush currents caused by power source reconnection ensures that any current trip circuitry in the power control will be activated only by short circuit conditions and not by abnormal inrush currents.

11 Claims, 2 Drawing Sheets

POWER CONTROL INTERRUPT MANAGEMENT

TECHNICAL FIELD

The present invention relates to solid state power controls, and more particularly to management of interruptions in solid state power controls.

BACKGROUND OF THE INVENTION

AC solid state power controls are often used in various applications to control operation of an AC input power source. During operation, the power control controls power to a load. The power control itself may be an assembly containing multiple power modules and an output stage. As is known in the art, an AC power source generates an output voltage in the form of a sine wave whose voltage equals zero two times in every period. The point at which the sine wave crosses zero voltage is called a "zero crossing."

The power control may contain an instantaneous current trip to protect the power control from potentially damaging high inrush or short circuit currents. The instantaneous current trip protects the power control output stage when turning on during short circuit conditions.

When the output stage receives instructions to switch to an ON state, the output stage turns on at the zero voltage crossing of the input power source. Because there is no current at the zero crossing, the current through the power control increases gradually as the sine wave progresses. If the output stage were turned on at a non-zero crossing in the middle of the sine wave, the instantaneous slope of the sine wave (i.e., dv/dt) would be very high, causing high inrush currents to travel through the power control undesirably. By contrast, when the device turns on at zero crossing, the dv/dt of the device output is negligible, keeping the current increase in the power control gradual.

In practice, however, external events may cause the source voltage to be applied on the output stage at non-zero crossing. For example, if a contactor in the power source is opened momentarily, or if the power source is first switched on or switched to a different power source and the solid state power control is already on, reapplying power to the power control (e.g., by reclosing the contact or connecting the power control to another power source) or applying power in the first instance, the power may not be applied precisely at the zero crossing. This may cause a high inrush current to occur, due to the higher dv/dt, than a zero crossing. This application of power at the non-zero crossing may cause a much greater inrush current, one that may exceed the instantaneous current protection of the solid state devices. The device would then switch off to protect itself. This switching of the input power source causes an abnormal condition that may lead to the solid-state device properly protecting itself, but leads to operation delays and inconvenience. Normal operation of most electric power systems will result in these momentary power input interruptions.

There is a desire for a way to detect these input voltage interruption conditions and provide a more reliably solid state power management to avoid tripping.

SUMMARY OF THE INVENTION

The present invention is directed to a solid state power control that includes a sensor to detect when the power control is disconnected from a power source or when the source is not present. Disconnecting the source turns off an output stage in the power control. While the source is disconnected from the power control, logic in the power control prevents a power control "on" command from reaching the output stage. When the power source is reconnected to the power control, the output stage remains off until the logic detects a zero crossing in the source. Likewise, if a power control receives an "on" command and no input voltage is present, the device is held off until the source voltage is applied, and a zero crossing is detected.

The sensor therefore prevents high inrush currents due to non-zero crossing dv/dt from occurring in the power control by turning off the output stage or keeping the output stage off when the power source is not present. As a result, when the power control is connected or reconnected to a source, the output stage remains off until the source reaches the zero crossing rather than turning on at the same time reconnection or connection occurs. Suppressing high inrush currents caused by power source connection or reconnection ensures that any current trip circuitry in the power control will be activated only by high current faults or short circuit conditions and not by large dv/dt inrush currents.

These and other features of the present invention can be best understood from the following specification and drawings, the following of which is a brief description.

DETAILED DESCRIPTION OF THE PREFERRED EMBODIMENT

Figure 1:
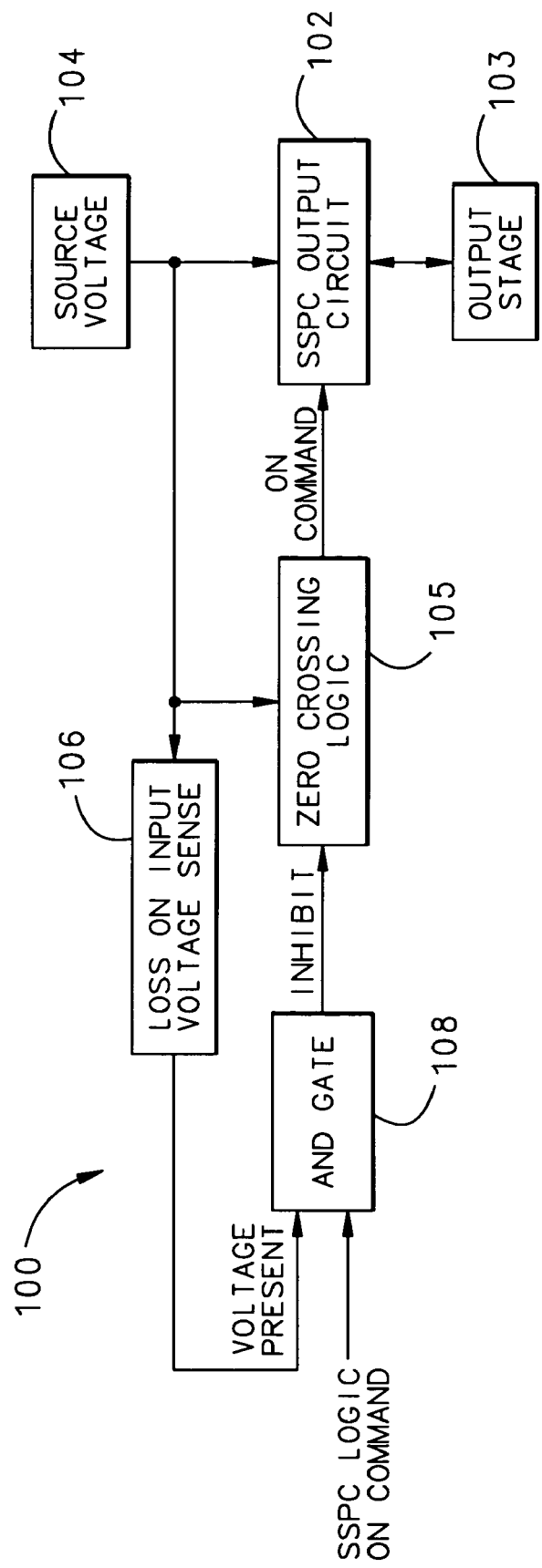
FIG. 1 is a block diagram illustrating components of a power control system according to one embodiment of the invention.
Figure 2:
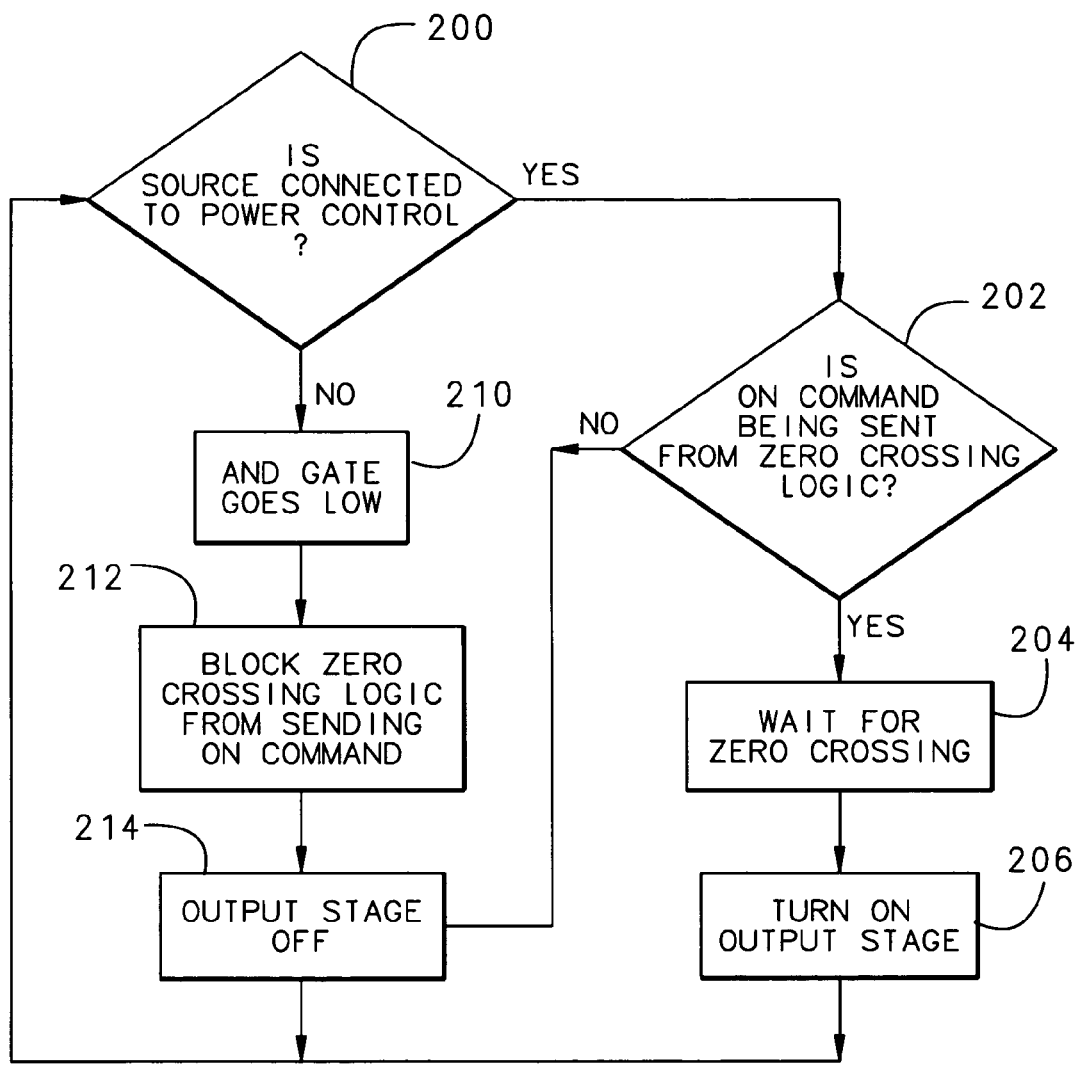
FIG. 2 is a flow diagram illustrating a process carried out by the power control to determine when to turn on an output stage of the power control.

FIG. 1 illustrates a portion of a power control 100 according to one embodiment of the invention. Note that FIG. 1 does not show all of the components of the power control 100 and omits current trip circuitry and logic circuitry, which can be any circuitry known in the art. FIG. 2 is a flow diagram of the power control operation.

Referring to FIG. 1, the power control 100 includes a power control output circuit 102 that receives energy from at least one power source 104, such as a voltage source, and a ON command from solid state power control (SSPC) logic circuitry (not shown). The output circuit 102 turns an output stage 103 of the power control 100 on in response to the ON command. Zero crossing logic 105 monitors the power source 104 to detect when the output of the power source 104 crosses zero. The power control 100 also includes a sensor 106, such as a sensor, that senses the input voltage from the power source 104 and generates a sensor output indicating if the power source 104 is turned on or otherwise present. Note that the power source 104 can be a current source and the sensor 106 can be a current sensor without departing from the scope of the invention. In one example, the sensor output is high when the power control 100 is connected to the power source 104 and is low when the power control 100 not connected to the power source 104. An AND gate 108 receives the ON command from the logic circuitry and the sensor output from the sensor 106.

The sensor 106 acts as an additional filter to ensure that the power source 104 is actually present at a given time and to filter out normal zero-crossings. During normal operation, the sensor 106 sends a high sensor output substantially continuously to the AND gate 108 as long as the power control 100 is connected to the power source 104. However, the output of the AND gate remains low until the SSPC logic sends the ON command to the AND gate 108, which requests the output stage 103 to be turned on.

When the AND gate 108 receives the ON command from the SSPC logic circuitry while also receiving a high sensor output, the output of the AND gate 108 goes high. The high AND gate output is sent to the zero crossing logic 105. Even though the zero crossing logic 105 receives a high signal from the AND gate 108, the zero crossing logic 105 does not transmit the ON command to the output circuit 102 until the power source 104 reaches the zero crossing. Once the power source 104 crosses zero while the zero crossing logic 105 is receiving a high signal from the AND gate 108, the zero crossing logic 105 outputs the ON command to the output circuit 102, thereby turning on the output stage 103.

If the power source 104 is not connected or is disconnected from the power control 100, however, the sensor 106 output will go low and the output circuit 102 turns off due to lack of power. In one embodiment, the sensor 106 detects whether the source voltage falls below a selected threshold for a predetermined time period. The voltage threshold and the time period may be selected according to expected system operating conditions. Moreover, the predetermined time period may either be a fixed time period or based on a number of cycles of the power source 104. The predetermined time period ensures that any detected drops in the source output are not due to noise or normal zero crossings, which do not require the output stage 103 to be turned off. The sensor 106 therefore ensures that the power source 104 is truly disconnected from the power control 100 before deciding not to output the sensor output to the AND gate 108.

Referring to FIG. 2, as explained above, the sensor 106 monitors whether the power control 100 is connected to the power source 104 (block 200). If it is, the zero crossing logic 105 in the power control 100 will also check whether it is receiving a high output from the AND gate 108, which indicates that the SSPC logic is sending the ON command (block 202) while the power source 104 is connected. The zero crossing logic 105 then waits for the zero crossing to occur (block 204) before passing the ON command to the output circuit 102 to turn on the output stage 103 (block 206).

If the output from the sensor 106 is low, indicating that the power source 104 is disconnected from the power control 100, the AND gate 108 will only receive the ON command from the SSPC logic. As a result, the AND gate 108 will generate a low output (block 210), causing the zero crossing logic 105 to not pass the ON command to the output circuit 102 (block 212). In this case, the output circuit 102 will remain off even if the SSPC logic sends an ON command because the AND gate 108 will inhibit the ON command from reaching the zero crossing logic 105. This in turn prevents the zero crossing logic 105 from sending the ON command to the output circuit 102 to turn on the output stage 103 (block 214).

When the power control 100 is connected again to the power source 104 (e.g., either reconnected to the same source as before or connected to a different source), the sensor 106 detects the reconnection and again sends a high output to the AND gate 108. The AND gate 108 in turn sends a high output to allow the ON command from the SSPC logic to be passed to the zero crossing logic 105. The zero crossing logic 105 then sends the ON command to the output circuit 102 when the source voltage crosses zero as explained above.

The sensor 106 therefore ensures that the output circuit 102 receives the ON command only at a zero crossing and only when the output stage 103 is turned off. Rather than keeping the output stage 103 in an ON state when the power source 104 is disconnected from the power control 100, output stage 103 turns off when the power source 104 is disconnected from the power control 100 or when no power source 100 is present. When the power source 104 is connected or reconnected to the power control 100, the output stage 103 is kept turned off until the zero crossing logic 105 detects the next zero crossing. As a result, the sensor 106 prevents the output stage 103 from being turned on at any time other than the zero crossing, minimizing inrush currents and thereby preventing conditions that would activate current trip circuitry in the power control 100.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A power control connectable to a power source, comprising:
    an output stage that turns off when the power source is not connected to the power control;
    zero crossing logic that detects a zero crossing of an output of the power source and takes a detected zero crossing as a command to turn on the output stage; and
    a sensor that detects when the power source is not connected to the power control and prevents the zero crossing logic from sending the command to the output stage if the power source is not connected to the power control.

2. The power control of claim 1, wherein the power source outputs a source voltage, and wherein the sensor detects when the power source is not connected to the power control by detecting when the source voltage drops below a selected threshold.

3. The power control of claim 2, wherein the sensor detects when the power source is not connected to the power control by detecting when the source voltage drops below the selected threshold for a predetermined time period.

4. The power control of claim 1, wherein the sensor generates a high sensor output when the power source is connected to the power control and a low sensor output when the power source is not connected to the power control.

5. The power control of claim 4, further comprising an AND gate that receives the sensor output and a second command to turn on the output stage.

6. The power control of claim 5, wherein the AND gate generates a low output to prevent the zero crossing logic from receiving the second command when the sensor output is low, and wherein the AND gate generates a high output to allow the zero crossing logic to receive the second command when the sensor output is high.

7. A method for controlling a power control having an output stage that turns off when a power source is not connected to the power control, comprising:
    detecting a zero crossing of an output of the power source;
    taking a detected zero crossing as a command to turn on the output stage;
    sensing when the power source is not connected to the power control; and
    preventing the output stage from receiving the command if the power source is not connected to the power control.

8. The method of claim 7, wherein the power source outputs a source voltage, and wherein the sensing step senses when the source voltage drops below a selected threshold for a predetermined time period.

9. The method of claim 1, further comprising generating a sensor output, wherein the sensor output is high when the power source is connected to the power control and wherein the sensor output is low when the power source is not connected to the power control.

10. The method of claim 9, further comprising conducting an AND operation on the sensor output and a second command to turn on the output stage, wherein the preventing step is conducted based on the result of the AND operation.

11. The method of claim 10, wherein the step of conducting the AND operation comprises:
   generating a low output to prevent the zero crossing logic from receiving the second command when the sensor output is low; and
   generating a high output to allow the zero crossing logic to receive the second command when the sensor output is high.

\* \* \* \* \*